(12) United States Patent
Wang et al.

(10) Patent No.: US 10,763,223 B2
(45) Date of Patent: Sep. 1, 2020

(54) SUBSTRATE STRUCTURE HAVING CHAMFERS

(71) Applicant: Siliconware Precision Industries Co., Ltd., Taichung (TW)

(72) Inventors: Po-Hao Wang, Taichung (TW); Chang-Fu Lin, Taichung (TW); Chun-Tang Lin, Taichung (TW); Bo-Hao Chang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/494,034

(22) Filed: Apr. 21, 2017

(65) Prior Publication Data
US 2017/0309579 A1    Oct. 26, 2017

(30) Foreign Application Priority Data

Apr. 25, 2016  (TW) .............................. 105112802 A

(51) Int. Cl.
*H01L 23/00*  (2006.01)
*H01L 23/31*  (2006.01)
*H01L 23/498*  (2006.01)

(52) U.S. Cl.
CPC ........ *H01L 23/562* (2013.01); *H01L 23/3114* (2013.01); *H01L 23/3128* (2013.01); *H01L 23/49816* (2013.01); *H01L 23/49822* (2013.01); *H01L 23/49827* (2013.01); *H01L 23/49838* (2013.01); *H01L 24/13* (2013.01); *H01L 24/16* (2013.01); *H01L 24/29* (2013.01); *H01L 24/32* (2013.01); *H01L 24/73* (2013.01); *H01L 2224/131* (2013.01); *H01L 2224/13082* (2013.01); *H01L 2224/13101* (2013.01); *H01L 2224/16225* (2013.01); *H01L 2224/2919* (2013.01); *H01L 2224/32225* (2013.01); *H01L 2224/73204* (2013.01); *H01L 2924/10155* (2013.01); *H01L 2924/10156* (2013.01); *H01L 2924/15159* (2013.01); *H01L 2924/15311* (2013.01); *H01L 2924/18161* (2013.01); *H01L 2924/3512* (2013.01); *H01L 2924/35121* (2013.01)

(58) Field of Classification Search
CPC . H01L 33/20; H01L 23/562; H01L 924/3512; H01L 23/49816; H01L 23/3128
See application file for complete search history.

(56) References Cited

U.S. PATENT DOCUMENTS

| | | | | |
|---|---|---|---|---|
| 5,449,255 A | * | 9/1995 | Katbi | B23B 27/143 407/114 |
| 2003/0015806 A1 | * | 1/2003 | Chiba | H01L 23/544 257/797 |
| 2005/0062135 A1 | * | 3/2005 | Tase | G06K 19/07728 257/620 |

(Continued)

*Primary Examiner* — Thanh Y. Tran
(74) *Attorney, Agent, or Firm* — Mintz Levin Cohn Ferris Glovsky and Popeo, P.C.; Peter F. Corless; Steven M. Jensen

(57) ABSTRACT

Provided is a substrate structure, including a substrate having at least one chamfer formed on a surface thereof, and a plurality of conductive bodies formed to the substrate. Therefore, a stress generated during the packaging process is alleviated through the chamfer, and the substrate structure is prevented from being cracked. An electronic package employing the substrate structure is also provided.

13 Claims, 6 Drawing Sheets

(56) References Cited

U.S. PATENT DOCUMENTS

| | | | | |
|---|---|---|---|---|
| 2006/0269367 | A1* | 11/2006 | Havrda | B23B 27/045 407/117 |
| 2007/0148914 | A1* | 6/2007 | Morita | B24B 37/042 438/458 |
| 2008/0217744 | A1* | 9/2008 | Murakami | H01L 23/142 257/622 |
| 2009/0023364 | A1* | 1/2009 | Kuo | H01L 21/02021 451/44 |
| 2010/0227695 | A1* | 9/2010 | Suzuki | B21J 13/025 464/141 |
| 2010/0314721 | A1* | 12/2010 | Chan | H01L 21/563 257/618 |
| 2016/0233175 | A1* | 8/2016 | Dubey | H01L 23/562 |

* cited by examiner

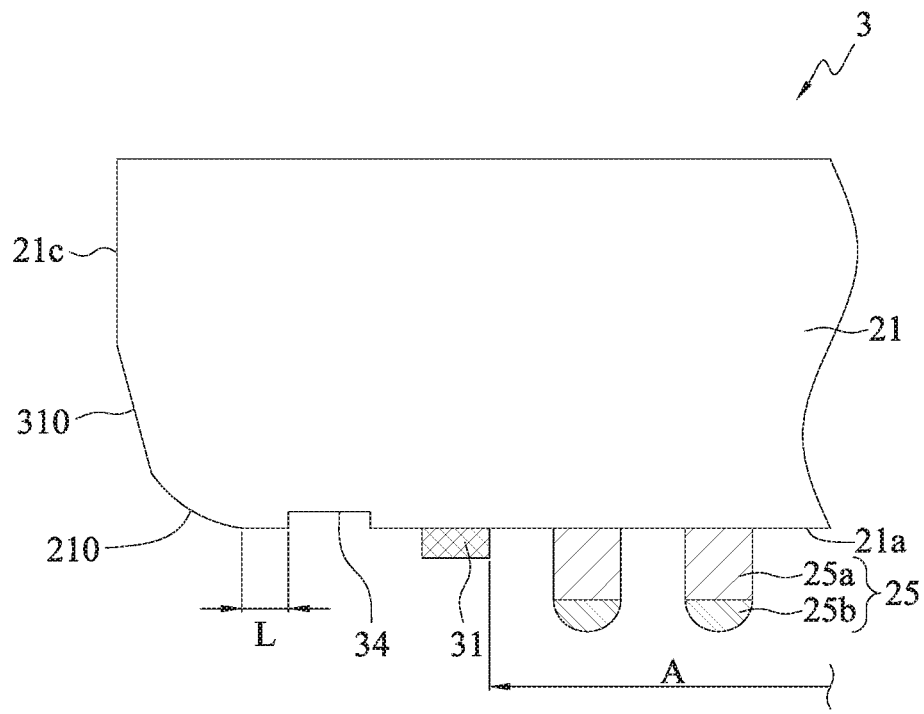
FIG. 3'
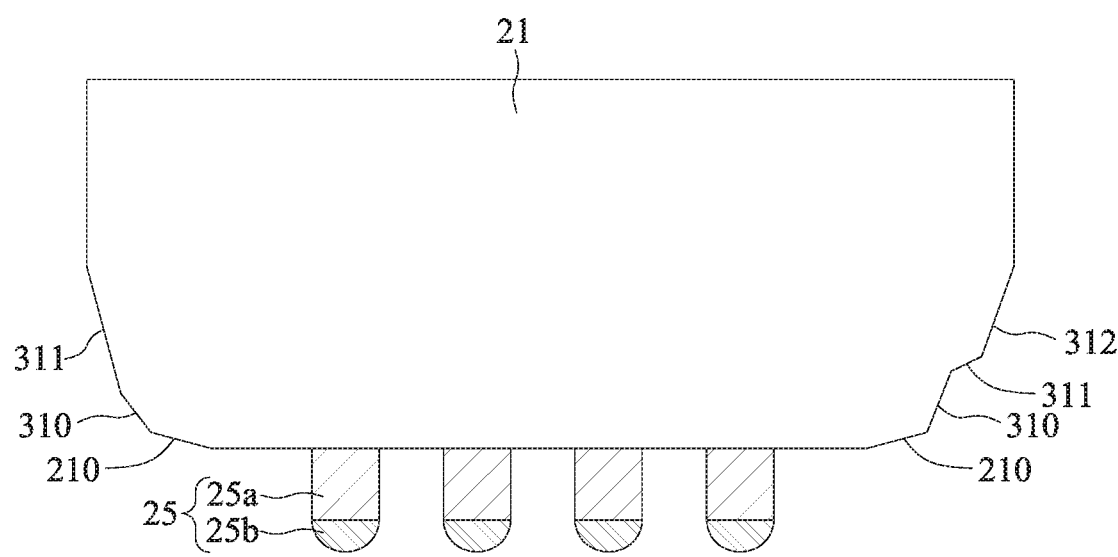
FIG. 3"

SUBSTRATE STRUCTURE HAVING CHAMFERS

CROSS-REFERENCE TO RELATED APPLICATION

This application claims under 35 U.S.C. § 119(a) the benefit of Taiwanese Patent Application No. 105112802 filed Apr. 25, 2016, the entire contents of which are incorporated herein by reference.

BACKGROUND

1. Technical Field

The present disclosure relates to semiconductor packages, and, more particularly, to an electronic package that has improved product yield and a substrate structure thereof.

2. Description of Related Art

There are numerous techniques used in chip packaging, including flip chip packaging, such as Chip Scale Package (CSP), Direct Chip Attached (DCA) and Multi-Chip Module (MCM), and 3D IC chip stacked modules that stack chips in a three-dimensional manner.

FIG. 1 is a schematic cross-sectional view of a conventional semiconductor package 1 in the 3D IC form. The semiconductor chip 13 is provided on a Through Silicon Interposer (TSI) 12 via a plurality of solder bumps 130. The TSI 12 has a plurality of Through Silicon Vias (TSVs) 120 and a redistribution layer (RDL) 121 electrically connecting the TSVs 120 and the solder bumps 130, and is formed onto a package substrate 11 via the TSVs 120 and a plurality of conductive elements 110. The conductive elements 110 and the solder bumps 130 are encapsulated with an underfill 10', and the semiconductor chip 13 and the TSI 12 is encapsulated by an encapsulant 10.

However, in the traditional packaging process of the semiconductor package 1, when temperature cycle or stress variation is encountered, large corner stress may be created at the corners of the semiconductor chip 13 and the TSI 12, causing cracks (such as cracks K in the diagram) to appear around the corners of the semiconductor chip 13 and the TSI 12. In addition, mismatch in coefficients of thermal expansion between the semiconductor wafer 13, the TSI 12 and the package substrate 11 may cause the encapsulant 10 or the underfill 10' to be detached, creating delamination. As such, the TSI 12 cannot be effectively connected to the semiconductor chip 13 or even leads to failures in reliability tests, resulting in poor product yield. The aforementioned problems become more prominent in today's quest for ever thinner and more compact electronic products.

Therefore, there is an urgent need to find a solution that overcomes the aforementioned problems in the prior art.

SUMMARY

In view of the foregoing shortcomings in the prior art, the present disclosure provides a substrate structure, which may include a substrate including at least one first chamfer formed on a surface thereof and a second chamfer extending from the first chamfer; and a plurality of conductive bodies formed to the substrate.

The present disclosure further provides an electronic package, which may include a carrier; at least one substrate disposed on the carrier and at least one first chamfer formed on a surface of the substrate; a plurality of conductive bodies electrically connected to the substrate and the carrier; and an encapsulating material formed between the substrate and the carrier.

In an embodiment, the encapsulating material encapsulates the substrate.

In an embodiment, the first chamfer is provided at a corner of the substrate.

In an embodiment, the surface of the substrate may be further formed with a recess free from penetrating the substrate. In another embodiment, the first chamfer and the recess may be spaced apart at a distance, and the recess may be provided at a corner of the substrate. In yet another embodiment, the recess may have a large opening width and a small inner space width, or a small opening width and a large inner space width.

In an embodiment, at least one of the conductive bodies is a circuit layer, a conductive pillar or a conductive bump.

In summary, the electronic package and the substrate structure in accordance with the present disclosure alleviate stress on the substrate through the first chamfer, and increase bonding between the substrate and the packaging layer with the provision of the recess, thereby eliminating the occurrences of cracks and delamination of the substrate during the packaging process and increasing the product yield.

DETAILED DESCRIPTION OF EMBODIMENTS

Figure 1:
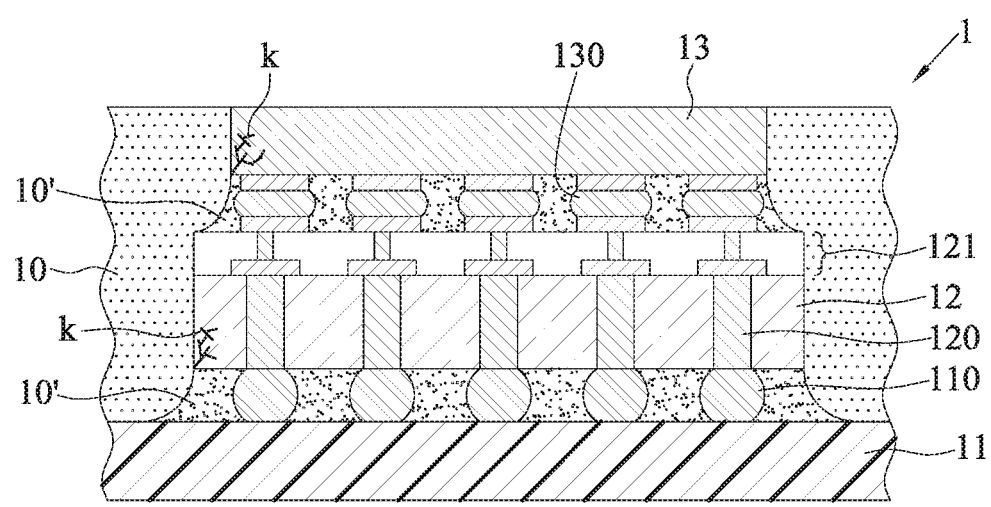
FIG. 1 is a schematic cross-sectional view of a conventional semiconductor package.

The present disclosure is described by the following specific embodiments. Those with ordinary skills in the arts can readily understand other advantages and functions of the present disclosure after reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "up", "first", "second", "third", "a", "one" and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 2:
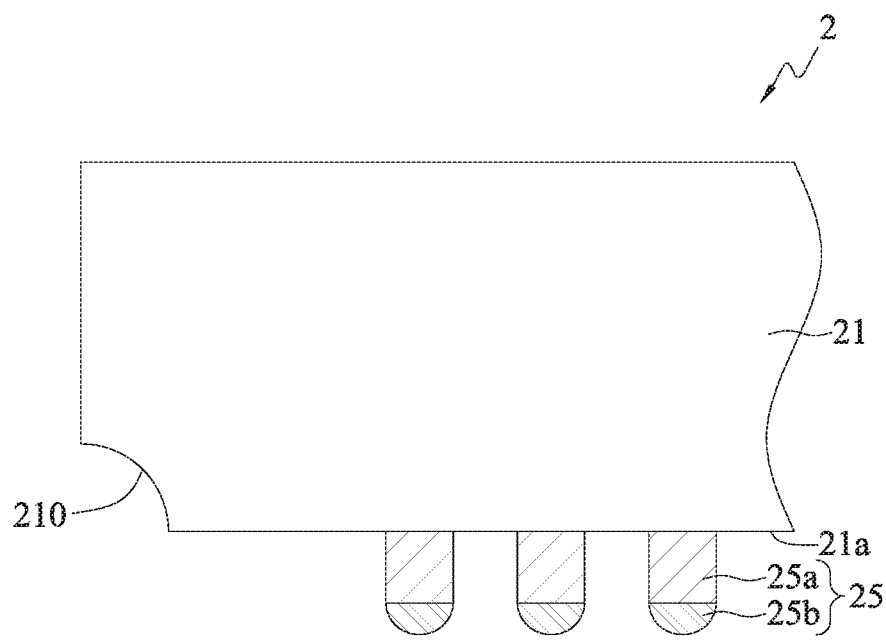
FIG. 2 is a schematic cross-sectional view of a substrate structure in accordance with the present disclosure.

FIG. 2 is a schematic cross-sectional view of a substrate structure 2 in accordance with the present disclosure. The substrate structure 2 includes a substrate 21 including at least one chamfer 210 formed on its surface, and a plurality of conductive bodies 25 formed to the substrate 21.

The substrate 21 can be a semiconductor material, and the first chamfer 210 is formed on an edge (e.g., a corner) of a surface 21a thereof. However, the substrate 21 can be made of, but not limited to, a ceramic material or an organic material, such as a glass fibre resin or a printed circuit board.

In an embodiment, the substrate 21 can be a silicon wafer, a silicon chip or a Through-Silicon Interposer (TSI) and can be in the form of a strip or singulated, and the first chamfer 210 is formed by cutting the substrate 21 with a trapezoidal knife.

Furthermore, the substrate 21 can be a board in any geometric shape, such as rectangle, polygon, circle, etc., and can be a symmetrical or nonsymmetrical board. Therefore, the substrate 21 may assume a variety of different appearances. Moreover, the surface of the first angle 210 may have a straight oblique face (such as that shown in FIG. 6), a concave arc face (such as those shown in FIGS. 2 and 3), a convex arc face (such as that shown in FIG. 3'), or other shapes.

The conductive bodies 25 can be selected from a group consisting of a circuit layer (not shown), conductive pillars and conductive bumps (such as those shown in FIG. 2).

In an embodiment, each of the conductive bodies 25 includes a metal pillar 25a and a solder material 25b.

Figure 3:
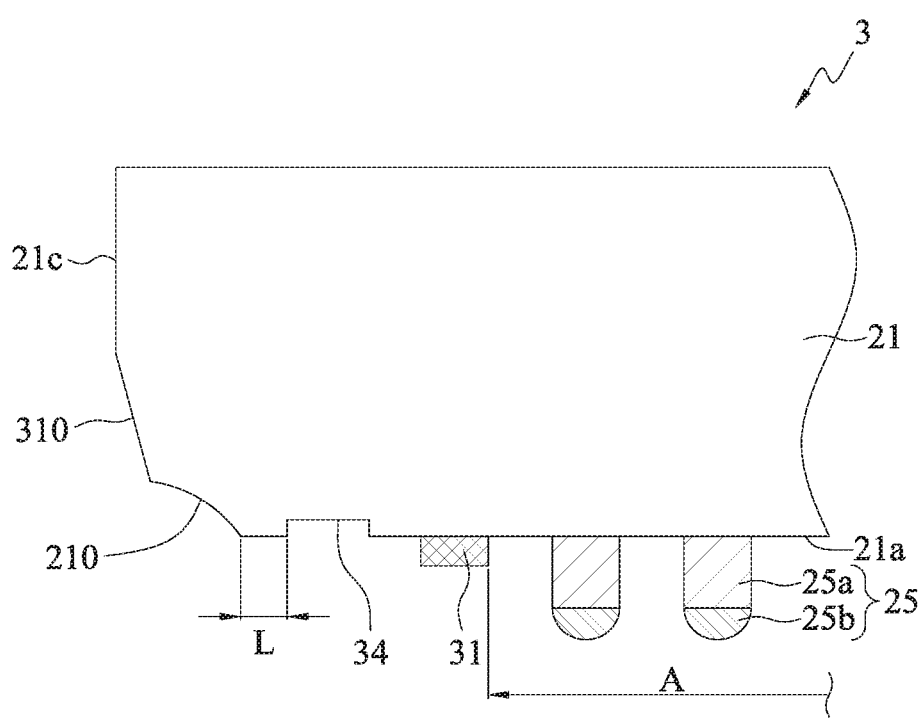
FIGS. 3, 3', 3'', and 3''' are schematic cross-sectional views of another embodiment of FIG. 2.
Figure 3:
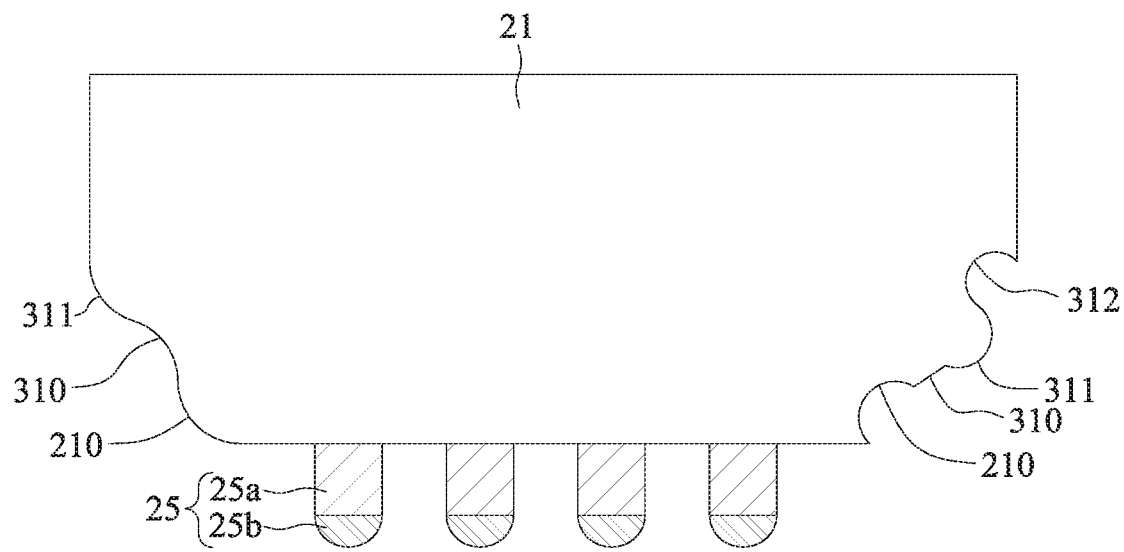

In another embodiment, as shown in FIGS. 3 and 3', the substrate structure 3 further includes a seal ring 31 provided on the surface 21a of the substrate 21. The seal ring 31 surrounds a layout area A of the substrate 21 (an area for laying out the conductive bodies 25), and at least one recess 34 not penetrating the substrate 21 is provided outside the seal ring 31 on the surface 21a of the substrate 21. The first angle 210 and the recess 34 are spaced apart at distance L. In other words, the recess 34 is situated between the first angle 210 and the seal ring 31 to prevent the cutting tool from touching the conductive bodies 25. This effectively prevents the metal material from shrinking and covering the cutting tool as a result of the cutting).

Figure 4:
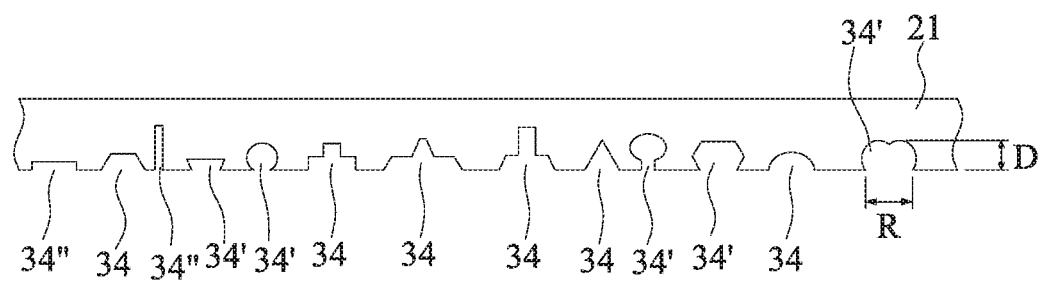
FIG. 4 is a schematic cross-sectional view of recesses in various shapes of a substrate structure in accordance with the present disclosure.
Figure 5A:
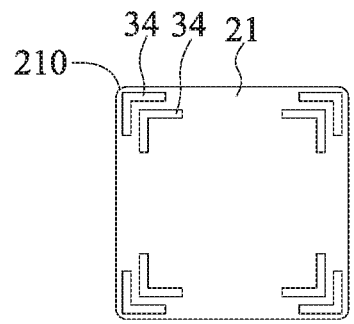
FIGS. 5A to 5F are schematic top views of different embodiments of a substrate structure in accordance with the present disclosure.
Figure 5B:
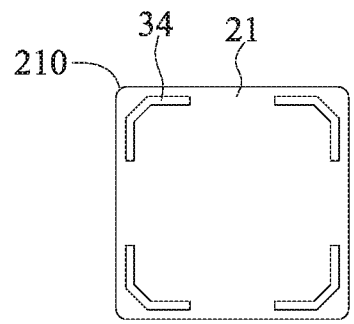
Figure 5C:
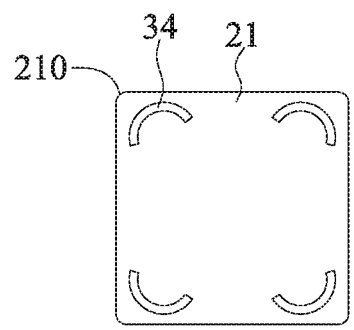
Figure 5D:
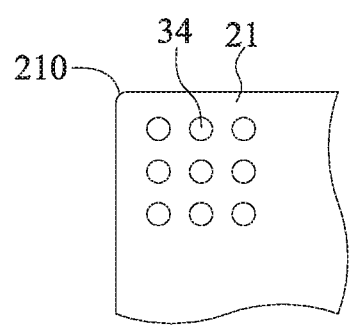
Figure 5E:
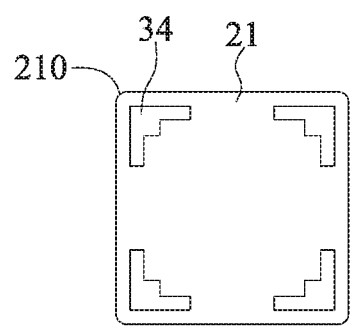
Figure 5F:
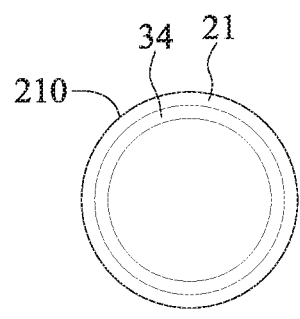

More specifically, there are numerous ways for manufacturing the recess 34, including ultrasonic polishing, chemical mechanical polishing (CMP), laser, water knife, isotropic/anisotropic etching, dry/wet etching or a combination of the above. Moreover, as shown in FIG. 4, the shape and size of the recess 34, 34', 34" may vary depending on the type of material used as an encapsulating material 60 shown in FIG. 6. In other words, the aspect ratio of the recess 34 allows the particles of the encapsulant to enter therein with no hindrance. For example, the maximum size of a particle in a filler contained in an existing encapsulant 6 is 3 μm, then the recess 34, 34', 34" has an opening width R greater than 3 μm (e.g., 10 μm) and a depth D about 3 to 6 μm. Therefore, the opening width R of the recess 34, 34', 34" needs to be greater than the particle size of the filler of the encapsulating material 60.

In addition, the recess 34 may assume various different appearances. As shown in FIG. 4, for example, the cross sections of the recesses 34, 34', 34" are cave-like with a plurality of sidewalls. Moreover, as shown in FIGS. 5A to 5F, the top view of the recess 34 may have any geometric shape (an arc, a polygonal, a circular shape or etc.). More specifically, as shown in FIG. 4, if the recess 34 has a large opening width and a small inner space width, and the fluidity of the encapsulating material 60 in the recess 34 is increased; alternatively, if the recess 34' has a small opening width and a large inner space width, bonding between the encapsulating material 60 and the recess 34' (that is, the encapsulating material 60 and the substrate 21) is increased. It should be understood that the widths of the opening and the inner space of the recess 34" can be the same.

In addition, the location of the recess 34 can be designed according to demands. For example, the recess 34 can be provided at areas of the substrate 21 where stress is concentrated during manufacturing of the substrate structure 3 to prevent cracks occurring in the substrate 21 and delamination of the encapsulating layer (e.g., an underfill 600 or an encapsulant 601, as will be described later). More specifically, as shown in FIGS. 5A to 5E, if the surface 21a of the substrate 21 has corners, during the packaging process, corner stress will occur at the various corners of the substrate 21 due to concentrated stress, and large stress is created between the corners and the encapsulating material 60, thus a recess 34 can be located at each of these corners.

In another embodiment, as shown in FIGS. 3 and 3', the substrate 21 has a second chamfer 310 extending from the first chamfer 210. In an embodiment, the second chamfer 310 extends along a side face 21c of the substrate 21, and the surface of the second chamfer 310 may be a straight face, an arc face, or some other shapes.

In another embodiment, as shown in FIGS. 3" and 3'", the substrate 21 further has a third chamfer 311 and a fourth chamfer 312 (or even more angles) extending from the second chamfer 310 sequentially, so as to reduce stress through increasing the numbers of chamfers. In addition, the surfaces of the chamfers may be, but not limited to, a straight face, a convexed or concaved arc face, or some other shapes, which are arranged appropriately.

In an embodiment, the substrate structure 3 further comprises chamfers extending from the second chamfer 310 sequentially. In another embodiment, the substrate structure 3 further comprises at least one chamfer extending in a direction different from another direction in which the second chamfer 310 extends from the first chamfer 210 and/or yet another direction in which the first chamfer 210 extends from the surface 21a of the substrate 21. In an embodiment, the third chamfer 311 extends from the second chamfer 310, and the fourth chamfer 312 extends from the third chamfer 311. In an embodiment, the substrate structure 3 further comprises a plurality of chamfers extending sequentially from the second chamfer 310 and forming an approximately straight line.

The substrate structure 2, 3 according to the present disclosure allows stress on the substrate structure 2, 3 created during the subsequent packaging process to be distributed through the design of the first chamfer 210, eliminating the issue of stress being concentrated at the corners of the substrate structure 2, 3, and preventing cracks or delamination from occurring in the substrate structure 2, 3 after packaging, thereby increasing the product yield.

In addition, with the design of the second chamfer 310, the substrate structure 3 achieves even better stress elimination.

Figure 6:
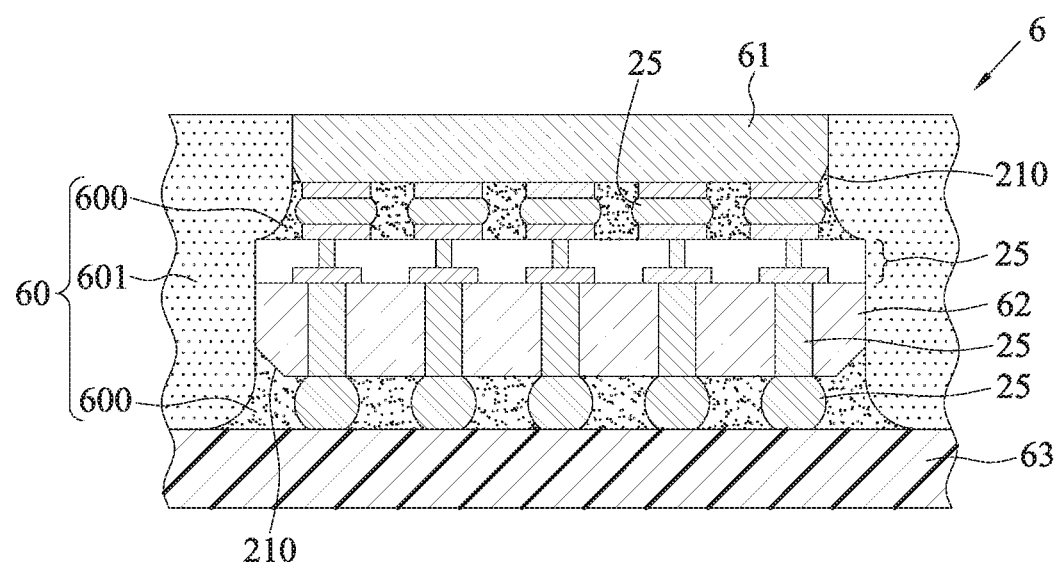
FIG. 6 is a schematic cross-sectional view of an electronic package in accordance with the present disclosure.

FIG. 6 is a schematic cross-sectional view of an electronic package 6 in accordance with the present disclosure. As shown in FIG. 6, the electronic package 6 includes a carrier 63, a first substrate 61, a second substrate 62 disposed on the carrier 63, and an encapsulating material 60.

The carrier 63 can be made of a ceramic or organic material used as a package substrate, and the first substrate 61 and the second substrate 62 are made of semiconductor materials. The second substrate 62 is used as an interposer and is placed directly on the carrier 63, while the first substrate 61 is used as an electronic element and is placed directly on the second substrate 62.

In an embodiment, the first substrate 61 (e.g., the electronic element) is an active element such as a semiconductor chip, a passive element, such as a resistor, a capacitor and an inductor, or a combination of both.

In an embodiment, the first substrate 61 (e.g., the electronic element) can be directly placed on the carrier (e.g., the package substrate), without the intermediate second substrate 62 (e.g., a TSI).

Moreover, the first chamfer 210 can be optionally formed on the first substrate 61 and/or the second substrate 62, and the seal ring 31, the recess 34 and/or the second chamfer 310 can be optionally formed on the first substrate 61 and/or the second substrate 62 as shown in FIGS. 3 and 3'.

The conductive bodies 25 are formed to the first substrate 61 and the second substrate 62 for electrically connecting the first substrate 61, the second substrate 62 and the carrier 63.

The encapsulating material 60 is formed on the carrier 63 to encapsulate the first substrate 61 and the second substrate 62.

In an embodiment, the encapsulating material 60 includes an underfill 600 and an encapsulant 601. The underfill 600 is formed between the first substrate 61 and the second substrate 62 and between the second substrate 62 and the carrier 63, and the encapsulant 601 is formed on the carrier 63 to encapsulate the underfill 600, the first substrate 61 and the second substrate 62.

The electronic package 6 according to the present disclosure allows stress on the first substrate 61 and the second substrate 62 created during formation of the encapsulating material 60 to be distributed through the design of the first chamfer 210, eliminating the issue of stress being concentrated at the corners of the first substrate 61 and the second substrate 62, and preventing cracks and/or delamination from occurring in the first substrate 61 and the second substrate 62 during the packaging process, thereby increasing the product yield.

In summary, the electronic package and the substrate structure in accordance with the present disclosure alleviate stress concentration and thus increase the product yield through the provision of chamfers.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. A substrate structure, comprising:
a substrate including at least one first chamfer formed on a surface thereof, a second chamfer extending from the first chamfer, and a third chamfer extending from the second chamfer in a first direction different from a second direction in which the second chamfer extends from the first chamfer, wherein the first chamfer, the second chamfer, and the third chamfer are not perpendicular to the surface, and the first chamfer is inclined relative to the surface; and
a plurality of conductive bodies formed to the surface of the substrate.

2. The substrate structure of claim 1, wherein the first chamfer is provided at a corner of the substrate.

3. The substrate structure of claim 1, further comprising a recess formed on the surface of the substrate with the recess free from penetrating the substrate.

4. The substrate structure of claim 3, wherein the first chamfer and the recess are spaced apart at a distance.

5. The substrate structure of claim 3, wherein the recess is provided at a corner of the substrate.

6. The substrate structure of claim 3, wherein the recess has an opening width and an inner space width less than the opening width.

7. The substrate structure of claim 3, wherein the recess has an opening width and an inner space width greater than the opening width.

8. The substrate structure of claim 1, wherein at least one of the conductive bodies is a circuit layer, a conductive pillar or a conductive bump.

9. The substrate structure of claim 1, wherein the substrate further comprises a fourth chamfer, the third and fourth chamfers extending from the second chamfer sequentially.

10. The substrate structure of claim 1, wherein the substrate further comprises a fourth chamfer extending from the third chamfer.

11. The substrate structure of claim 1, wherein the substrate further comprises a fourth chamfer, the third and fourth chamfers extending sequentially from the second chamfer and forming an approximately straight line.

12. The substrate structure of claim 1, wherein the third chamfer extends in the first direction different from a third direction in which the first chamfer extends from the surface of the substrate.

13. The substrate structure of claim 1, wherein the surfaces of the first and second chamfers each have a straight face, a convexed or concaved arc face.

* * * * *